United States Patent
Kim et al.

(10) Patent No.: US 9,900,020 B2
(45) Date of Patent: Feb. 20, 2018

(54) DIGITAL/ANALOG CONVERTER AND COMMUNICATION DEVICE INCLUDING THE SAME

(71) Applicant: Samsung Electronics Co., Ltd., Suwon-si, Gyeonggi-do (KR)

(72) Inventors: Jae-kwon Kim, Jeongseon-gun (KR); Jong-woo Lee, Seoul (KR); Yang-hun Lee, Suwon-si (KR); Woo-jin Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/493,877

(22) Filed: Apr. 21, 2017

(65) Prior Publication Data
US 2017/0331487 A1    Nov. 16, 2017

(30) Foreign Application Priority Data

May 11, 2016  (KR) .................. 10-2016-0057818
Jul. 22, 2016  (KR) .................. 10-2016-0093464

(51) Int. Cl.
H03M 1/66     (2006.01)
H03M 1/10     (2006.01)

(52) U.S. Cl.
CPC ....... H03M 1/1014 (2013.01); H03M 1/1009 (2013.01); H03M 1/66 (2013.01)

(58) Field of Classification Search
CPC ..... H03M 1/1014; H03M 1/1009; H03M 1/66
USPC .................................. 341/144, 120
See application file for complete search history.

(56) References Cited

U.S. PATENT DOCUMENTS

| | | | |
|---|---|---|---|
| 4,673,917 A * | 6/1987 | Urschel | H03M 1/1014 |
| | | | 341/118 |
| 6,897,794 B2 | 5/2005 | Kuyel et al. | |
| 6,917,316 B2 | 7/2005 | Blackburn | |
| 7,002,496 B2 | 2/2006 | Kuyel | |
| 8,059,021 B2 | 11/2011 | Kuramochi | |
| 8,154,432 B2 | 4/2012 | Kaper | |
| 8,179,295 B2 * | 5/2012 | Ho | H03M 1/1057 |
| | | | 341/136 |
| 8,493,251 B2 * | 7/2013 | Riches | H03M 1/1004 |
| | | | 341/120 |
| 8,502,714 B2 | 8/2013 | Chen et al. | |

(Continued)

FOREIGN PATENT DOCUMENTS

| | | |
|---|---|---|
| JP | 1998-300826 | 11/1998 |
| JP | 2001-308705 A | 11/2001 |

(Continued)

*Primary Examiner* — Brian Young
(74) *Attorney, Agent, or Firm* — Harness, Dickey & Pierce, P.L.C.

(57) ABSTRACT

A digital/analog converter (DAC) includes a reference current generator including an internal resistor, and configured to generate reference current according to a resistance value of the internal resistor and a reference voltage, a digital gain block configured to generate a calibrated digital input signal that is obtained by adjusting a digital gain of a digital input signal based on a ratio between a reference resistance value and a resistance value of the internal resistor, and a conversion circuit configured to convert the calibrated digital input signal into an analog output signal, based on the reference current.

19 Claims, 16 Drawing Sheets

(56) References Cited

U.S. PATENT DOCUMENTS 8,576,101 B1 * 11/2013 Lin .................... H03M 1/1042
                                                  341/118
8,970,306 B2    3/2015 Hagisawa et al.

FOREIGN PATENT DOCUMENTS

KR      10-1175230 B1    8/2012
KR      10-1453854 B1    10/2014

* cited by examiner

FIG. 9

| VOLTAGE | FSD |
|---------|------|
| V_1 | 1.10 |
| V_2 | 1.05 |
| V_ref | 1.00 |
| V_3 | 0.95 |
| V_4 | 0.90 |

DIGITAL/ANALOG CONVERTER AND COMMUNICATION DEVICE INCLUDING THE SAME

CROSS-REFERENCE TO RELATED APPLICATIONS

This application claims the benefit of Korean Patent Application No. 10-2016-0057818, filed on May 11, 2016, and Korean Patent Application No. 10-2016-0093464, filed on Jul. 22, 2016, in the Korean Intellectual Property Office, the disclosures of each of which are incorporated herein in their entireties by reference.

BACKGROUND

Example embodiments of the inventive concepts relate to a communication device, and/or a method of operating the same. For example, at least some example embodiments relate to a digital/analog converter (DAC), a communication device including the same, a method of calibrating output from the DAC, and/or a digital/analog conversion method.

A transmission end of the communication device may include a DAC configured to convert a digital signal, generated by a modem, into an analog signal. The DAC generates a reference current and performs digital/analog conversion based on the generated reference current such that the DAC may produce errors due to variations in the reference current.

SUMMARY

Some example embodiment of the inventive concepts relate to a digital/analog converter (DAC).

In some example embodiments, the DAC includes a reference current generator including an internal resistor, the reference current generator configured to generate a reference current according to a resistance value of the internal resistor and a reference voltage; a digital gain block configured to generate a calibrated digital input signal by adjusting a digital gain of a digital input signal based on a ratio between a reference resistance value and a resistance value of the internal resistor; and a conversion circuit configured to convert the calibrated digital input signal into an analog output signal based on the reference current.

Some other example embodiments of the inventive concepts relate to a communication device.

In some example embodiments, the communication device includes a digital signal generator configured to generate at least one digital input signal; and a digital/analog converter (DAC) configured to, generate at least one calibrated digital input signal by adjusting a digital gain of the at least one digital input signal based on a resistance value of an internal resistor, and convert the at least one calibrated digital input signal into at least one analog output signal based on reference current, the reference current being based on the internal resistor.

Some other example embodiments relate to a digital-to-analog converter (DAC) configured to convert a digital input signal to an analog output signal.

In some example embodiments, the DAC includes an internal resistor having an internal resistance value associated therewith, the internal resistor configured to have a first reference current flowing therethrough; and processing circuitry configured to, generate a calibrated digital input signal by adjusting a digital gain of the digital input signal based on the internal resistance value, and convert the calibrated digital input signal into the analog output signal based on the first reference current.

BRIEF DESCRIPTION OF THE DRAWINGS

Example embodiments of the inventive concepts will be more clearly understood from the following detailed description taken in conjunction with the accompanying drawings in which:

FIG. 9 is a table showing full-scale data stored in an internal memory, according to an example embodiment;

DETAILED DESCRIPTION

As used herein, the term "and/or" includes any and all combinations of one or more of the associated listed items. Expressions such as "at least one of", when preceding a list of elements, modify the entire list of elements and do not modify the individual elements of the list.

Hereinafter, example embodiments are described in detail with reference to the attached drawings.

Figure 1:
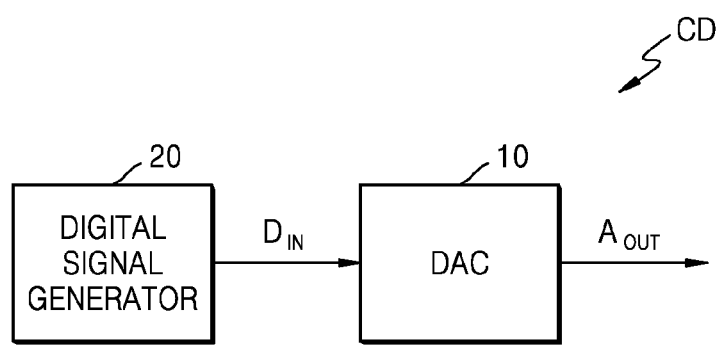
FIG. 1 is a schematic block diagram of a communication device according to an example embodiment.

FIG. 1 is a schematic block diagram of a communication device according to an example embodiment.

Referring to FIG. 1, a communication device CD may include a digital signal generator 20 and a digital/analog converter (DAC) 10.

According to an example embodiment, the communication device CD may refer to a transmission terminal configured to perform transmission of various information. However, example embodiments are not limited thereto. For example, according to one or more example embodiments, the communication device CD may refer to a reception terminal configured to receive various information or a transceiver configured to perform both transmission and reception functions.

The digital signal generator 20 may generate a digital input signal $D_{IN}$, and the DAC 10 may convert the digital input signal $D_{IN}$ to an analog output signal $A_{OUT}$.

In some example embodiments, the DAC 10 may include an internal resistor, and the DAC 10 may be configured to generate a calibrated digital input signal that is obtained by calibrating the digital input signal $D_{IN}$ based on a resistance value of the internal resistor, and to convert the calibrated digital input signal into the analog output signal $A_{OUT}$. Accordingly, the DAC 10 may reduce fluctuation in the output from the DAC 10, which may be caused by fluctuation in a resistance value of the internal resistor due to a tolerance in a process. Accordingly, an accuracy of an output from the DAC 10 may be enhanced.

According to an example embodiment, the digital signal generator 20 and the DAC 10 may be implemented as a single chip. For example, the digital signal generator 20 and the DAC 10 may be implemented as a communication chip such as a modem chip. However, example embodiments are not limited thereto. According to one or more example embodiments, the digital signal generator 20 and the DAC 10 may be implemented as different chips from each other. Hereinafter, various example embodiments of the DAC 10 are described in detail with reference to FIGS. 2 through 6.

Figure 2:
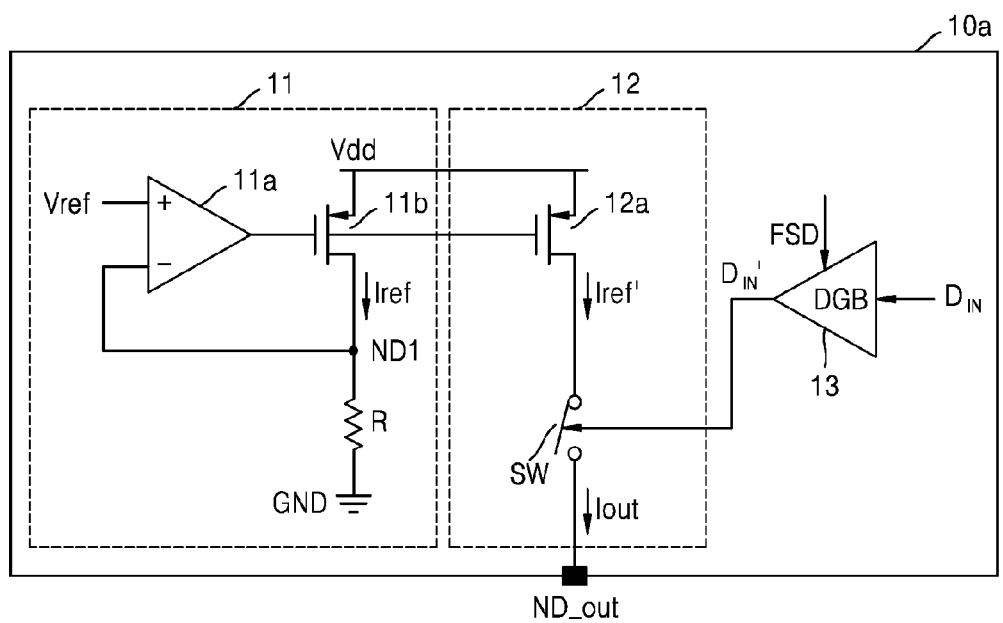
FIGS. 2 through 6 are respective block diagrams of digital/analog converters (DACs) according to one or more example embodiments.

FIG. 2 is a block diagram of a DAC 10a according to an example embodiment.

Referring to FIG. 2, the DAC 10a may include a reference current generator 11, a conversion circuit 12, and a digital gain block (DGB) 13. The DAC 10a may be implemented as a part of a chip (for example, a communication chip).

According to an example embodiment, an input to the DAC 10a may be received from another block in the chip (for example, the digital signal generator 20 shown in FIG. 1), and an output from the DAC 10a may be provided to the outside via an output terminal of the chip, that is, an output node ND_out. However, example embodiments are not limited thereto. According to an example embodiment, an output from the DAC 10a may be provided to another block in the chip. Additionally, according to one or more example embodiments, an input to the DAC 10a may be received from the outside via an input terminal of the chip.

The reference current generator 11 may include an internal resistor R, an amplifier 11a, and a first current source 11b. The reference current generator 11 may generate first reference current Iref according to a resistance value Rin of the internal resistor R (hereinafter referred to as an 'internal resistance value') and a reference voltage Vref. In some example embodiments, the reference current generator 11 may generate the first reference current Iref, based not on an external resistor connected to the chip but on the internal resistor R of the chip. Accordingly, since an area of the chip for implementing an external resistor may not be needed, and the chip may not include a connection terminal (for example, a solder ball or the like) configured to connect the DAC 10a to the external resistor, the size of the chip may be reduced.

The internal resistor R may be connected between a first node ND1 and a ground terminal GND. The amplifier 11a may include a first input terminal (for example, a positive (+) input terminal) to which the reference voltage Vref is applied, and a second input terminal (for example, a negative (−) input terminal) connected to the first node ND1. However, example embodiments are not limited thereto. According to one or more example embodiments, the internal resistor R may be implemented as a plurality of resistance devices, and the plurality of resistance devices may be connected to each other in series, in parallel, or in series-parallel with each other. Additionally, according to one or more example embodiments, the first node ND1 may correspond to any node between the plurality of resistance devices.

The first current source 11b may be driven according to output from the amplifier 11a, and generate the first reference current Iref. In detail, the first current source 11b may implemented as a p-channel metal oxide semiconductor (PMOS) transistor having a gate to which output from the amplifier 11a is applied, a source connected to a power voltage terminal Vdd, and a drain connected to the first node ND1. However, example embodiments are not limited thereto. The first current source 11b may include a plurality of PMOS transistors. As such, the reference current generator 11 may have any configuration in which a first reference current Iref may be generated according to an internal resistance value Rin and a reference voltage Vref.

Since a voltage at the first node ND1 corresponds to the reference voltage Vref according to a virtual ground principle of the amplifier 11a, the first reference current Iref may correspond to a value obtained by dividing a value of the reference voltage Vref by the internal resistance value Rin (that is, Iref=Vref/Rin). The reference voltage Vref may be provided from a band-gap reference circuit in the chip. Since the band-gap reference circuit is a voltage generation circuit that is insensitive to a temperature change, the reference voltage Vref may have a substantially fixed value. Accordingly, the first reference current Iref may substantially vary with the internal resistance value Rin.

Since the DAC 10a performs digital/analog conversion based on the first reference current Iref generated by the reference current generator 11, it may be desirable to precisely control the first reference current Iref. If the internal resistor R is manufactured in the same chip as the DAC 10a, a fluctuation in the internal resistance value Rin may be great due to tolerance in a manufacturing process. In some example embodiments, the DAC 10a may include the DGB 13 so as to reduce output fluctuation that may be caused by fluctuation in the internal resistance value Rin. Hereinafter, an operation of the DGB 13 is described in detail.

The DGB 13 may provide a calibrated digital input signal $D_{IN}'$, which is obtained by calibrating a digital input signal $D_{IN}$ based on the internal resistance value Rin, to the conversion circuit 12. In detail, the DGB 13 may adjust a digital gain of the digital input signal $D_{IN}$ based on a ratio between a reference resistance value and the internal resistance value Rin, and provide the calibrated digital input signal $D_{IN}'$ to the conversion circuit 12. Here, the digital gain may correspond to a ratio of an output from the DGB 13, that is, the calibrated digital input signal $D_{IN}'$, to an input to the DGB 13, that is, the digital input signal $D_{IN}$.

In some example embodiments, the DGB 13 may adjust a digital gain of the digital input signal $D_{IN}$ by using a ratio of the internal resistance value Rin to a reference resistance value. Accordingly, the DGB 13 may calibrate the digital input signal $D_{IN}$ by increasing or decreasing an amplitude of the digital input signal $D_{IN}$, and provide the calibrated digital input signal $D_{IN}'$ to the conversion circuit 12.

In detail, if the internal resistance value Rin is greater than a reference resistance value, the DGB 13 may increase a digital gain and provide the calibrated digital input signal $D_{IN}'$ to the conversion circuit 12. For example, if the digital input signal is "1001", the DGB 13 may calibrate the digital input signal $D_{IN}$ to a value greater than "1001", for example, "1011", by increasing the digital gain. If the internal resistance value Rin is less than a reference resistance value, the DGB 13 may decrease a digital gain, and provide the calibrated digital input signal $D_{IN}'$ to the conversion circuit 12. For example, if the digital input signal is "1001", the DGB 13 may calibrate the digital input signal $D_{IN}$ to a value less than "1001", for example, "1000", by decreasing the digital gain.

According to an example embodiment, the DGB 13 may calibrate the digital input signal $D_{IN}$ based on a ratio between reference full-scale data that is obtained according to a reference resistance value, and output full-scale data FSD that is obtained according to the internal resistance value Rin. Here, the full-scale data FSD may refer to a full-scale analog signal level, that is, an analog signal level corresponding to the digital input signal $D_{IN}$ having a maximum value. The reference full-scale data may be determined (or, alternatively predetermined) by a user, and the output full-scale data FSD may be obtained when an initial chip test is performed on the DAC 10a. The DGB 13 may receive the reference full-scale data and the output full-scale data FSD from a storage device in the chip or a storage device located outside the chip. The output full-scale data FSD is described in detail with reference to FIG. 3.

The conversion circuit 12 may include a second current source 12a and a switch SW. The conversion circuit 12 may convert the calibrated digital input signal $D_{IN}'$ into an analog current signal Iout, based on a second reference current Iref' corresponding to the first reference current Iref. In some example embodiments, the conversion circuit 12 may perform digital/analog conversion not on the digital input signal $D_{IN}$, but on the calibrated digital input signal $D_{IN}'$. Accordingly, the performance of the DAC 10a may be enhanced by reducing an error in conversion performed by the DAC 10a.

The second current source 12a may be driven according to an output from the amplifier 11a, and generate the second reference current Iref'. In detail, the second current source 12a may implemented as a PMOS transistor having a gate to which an output from the amplifier 11a is applied, a source connected to the power voltage terminal Vdd, and a drain connected to the switch SW. The second current source 12a may generate the second reference current Iref' such that the second reference current Iref' is proportional to the first reference current Iref. However, example embodiments are not limited thereto, and the second current source 12a may include a plurality of PMOS transistors. As such, the second current source 12a may have any configuration in which the second reference current Iref' proportional to the first reference current Iref may be generated. The switch SW may be driven according to the calibrated digital input signal $D_{IN}'$, and generate the analog current signal Iout from the second reference current Iref'.

According to an example embodiment, if the calibrated digital input signal $D_{IN}'$ is an N-bit signal (where N is a positive integer), the conversion circuit 12 may be configured to include $2^N$ second current sources and $2^N$ switches. The analog current signal Iout may correspond to a sum of current output from the $2^N$ switches. According to an example embodiment, the DAC 10a may further include a latch between the DGB 13 and the switch SW, and if the calibrated digital input signal $D_{IN}'$ is an N-bit signal, the latch may be implemented as $2^N$ latches. However, example embodiments are not limited thereto. If the calibrated digital input signal $D_{IN}'$ is an N-bit signal, the number of second current sources and switches included in the conversion circuit 12, and the number of latches may be changed according to a design of a circuit.

As described above, in the current embodiment, the DAC 10a may generate the first reference current Iref by using the internal resistor R, generate the calibrated digital input signal $D_{IN}'$ by adjusting a digital gain of the digital input signal $D_{IN}$ based on the internal resistance value Rin, and perform digital/analog conversion on the calibrated digital input signal $D_{IN}'$. Accordingly, the DAC 10a may reduce fluctuation in an output from the DAC 10a, which may be caused by a fluctuation in a resistance value of the internal resistor R due to tolerance in a process. Thus, the accuracy of an output from the DAC 10a may increase, and the size of the chip may be reduced.

Figure 3:
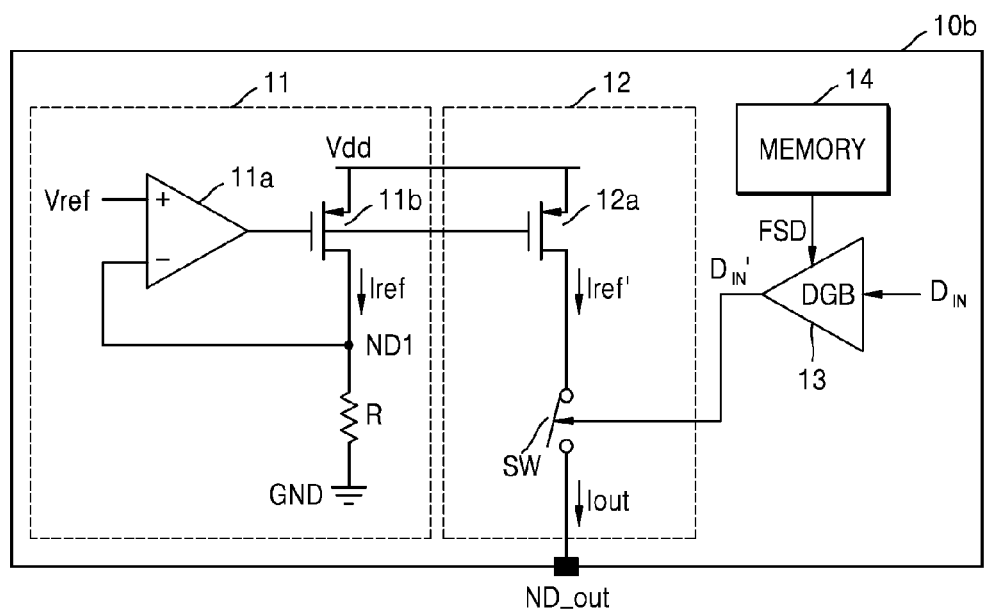

FIG. 3 is a block diagram of a DAC 10b according to an example embodiment.

Referring to FIG. 3, the DAC 10b is a modified example embodiment of the DAC 10a shown in FIG. 2, and may further include an internal memory 14, compared to the DAC 10a shown in FIG. 2. For example, the internal memory 14 may be embodied as a one-time programmable (OTP) memory. However, example embodiments are not limited thereto, and the internal memory 14 may be any memory included in a chip. For example, any non-volatile memory device such as a read-only memory, flash memory, Ferroelectric RAM, magnetic computer storage devices (e.g. hard disk drives, floppy disks, and magnetic tape), and optical discs.

The internal memory 14 may store a result of an initial chip test performed on the DAC 10b. The result of the initial chip test may correspond to a voltage level corresponding to an analog current signal Iout that is obtained according to a test performed before the DAC 10b is shipped from the factory. According to an embodiment, the initial chip test may be performed by applying full-scale digital input data $D_{IN}$ to the DAC 10b, and the result of the initial chip test may be referred to as output full-scale data FSD. The output full-scale data FSD may be an analog voltage level or digital data corresponding to the analog voltage level.

Since the DAC 10b generates first reference current Iref based on an internal resistance value Rin, respective chips may have different internal resistance values Rin from each other due to tolerance in a process, and accordingly, the respective chips may have first reference currents Iref different from each other. Additionally, since the DAC 10b outputs an analog current signal Iout based on second reference current Iref corresponding to the first reference current Iref, even if the full-scale digital input data $D_{IN}$ is applied to the DAC 10b, the respective chips may have pieces of output full-scale data FSD different from each other. Accordingly, the output full-scale data FSD may be a value that may change based on the internal resistance value Rin.

The DGB 13 may receive the output full-scale data FSD from the internal memory 14, and adjust a digital gain of the digital input signal $D_{IN}$ by using the output full-scale data FSD. According to an example embodiment, the DGB 13 may adjust a digital gain of the digital input signal $D_{IN}$, by using a gain factor (GF) that is obtained according to a ratio of the reference full-scale data (RFSD) to the output full-scale data FSD (in other words, GF=RFSD/FSD).

The reference full-scale data may be determined (or, alternatively, predetermined) by a user, and stored in the internal memory 14. If the internal resistor R of the DAC 10b has a reference resistance value, the reference full-scale data may be an analog voltage level corresponding to the analog current signal Iout converted from a full-scale digital input signal $D_{IN}$. The output full-scale data FSD may be an analog voltage level corresponding to the analog current signal Iout converted from a full-scale digital input signal $D_{IN}$ according to the resistance value Rin of the internal resistor R of the DAC 10b.

According to an example embodiment, the DGB 13 may provide a calibrated digital input signal $D_{IN}'$, which is obtained by performing an operation on the digital input signal $D_{IN}$ and the gain factor, to the conversion circuit 12. For example, the DGB 13 may provide a calibrated digital input signal $D_{IN}'$, which is obtained by performing a multiplication operation on the digital input signal $D_{IN}$ and the gain factor GF, to the conversion circuit 12. Accordingly, if the gain factor is greater than 1, an amplitude of the calibrated digital input signal $D_{IN}'$ may be greater than an amplitude of the digital input signal $D_{IN}$. If the gain factor is less than 1, an amplitude of the calibrated digital input signal $D_{IN}'$ may be less than an amplitude of the digital input signal $D_{IN}$.

Figure 4:
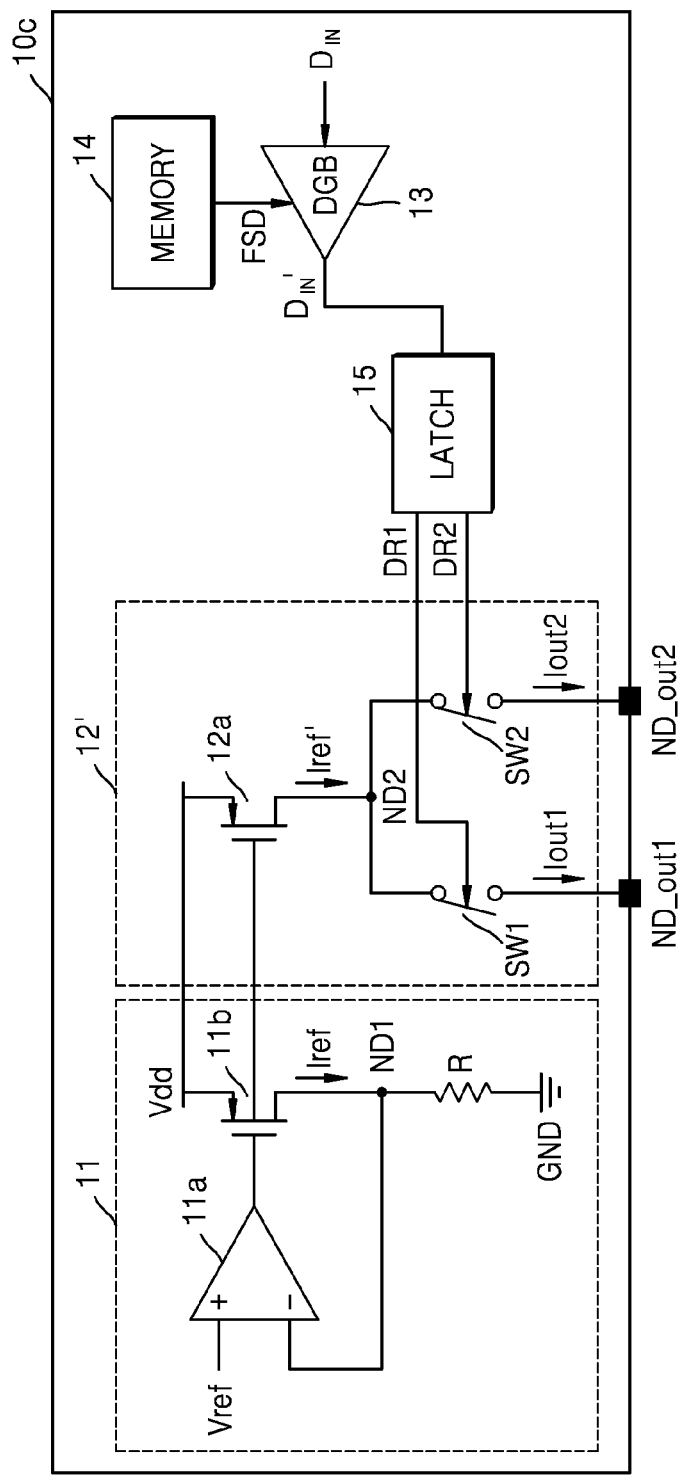

FIG. 4 is a block diagram of a DAC 10c according to an example embodiment.

Referring to FIG. 4, the DAC 10c is a modified example embodiment of the DAC 10b shown in FIG. 3, and may receive a digital input signal $D_{IN}$ that is a single-ended signal and generate first and second analog current signals Iout1 and Iout2 that are differential signals. A chip in which the DAC 10c is configured may include first and second output nodes ND_out1 and ND_out2, and the DAC 10c may output the first and second analog current signals Iout1 and Iout2 via the first and second output nodes ND_out1 and ND_out2, respectively.

The DAC 10c may further include a latch 15, compared to the DAC 10b shown in FIG. 3. The latch 15 may latch a calibrated digital input signal $D_{IN}'$, and generate first and second driving signals DR1 and DR2. The first and second driving signals DR1 and DR2 may have logical levels that are inverted from each other. The latch 15 may operate in synchronization with a clock signal, and be configured to include a plurality of latches. The number of latches may vary with the number of bits of the digital input signal $D_{IN}$.

A conversion circuit 12' may include a second current source 12a and a pair of switches including first and second switches SW1 and SW2. The first switch SW1 may turn on/off according to the first driving signal DR1, generate a first analog current signal Iout1 from the second reference current Iref', and provide the generated first analog current signal Iout1 to the first output node ND_out1. The second switch SW2 may turn on/off according to the second driving signal DR2, generate a second analog current signal Iout2 from the second reference current Iref', and provide the generated second analog current signal Iout2 to the second output node ND_out2.

Figure 5:
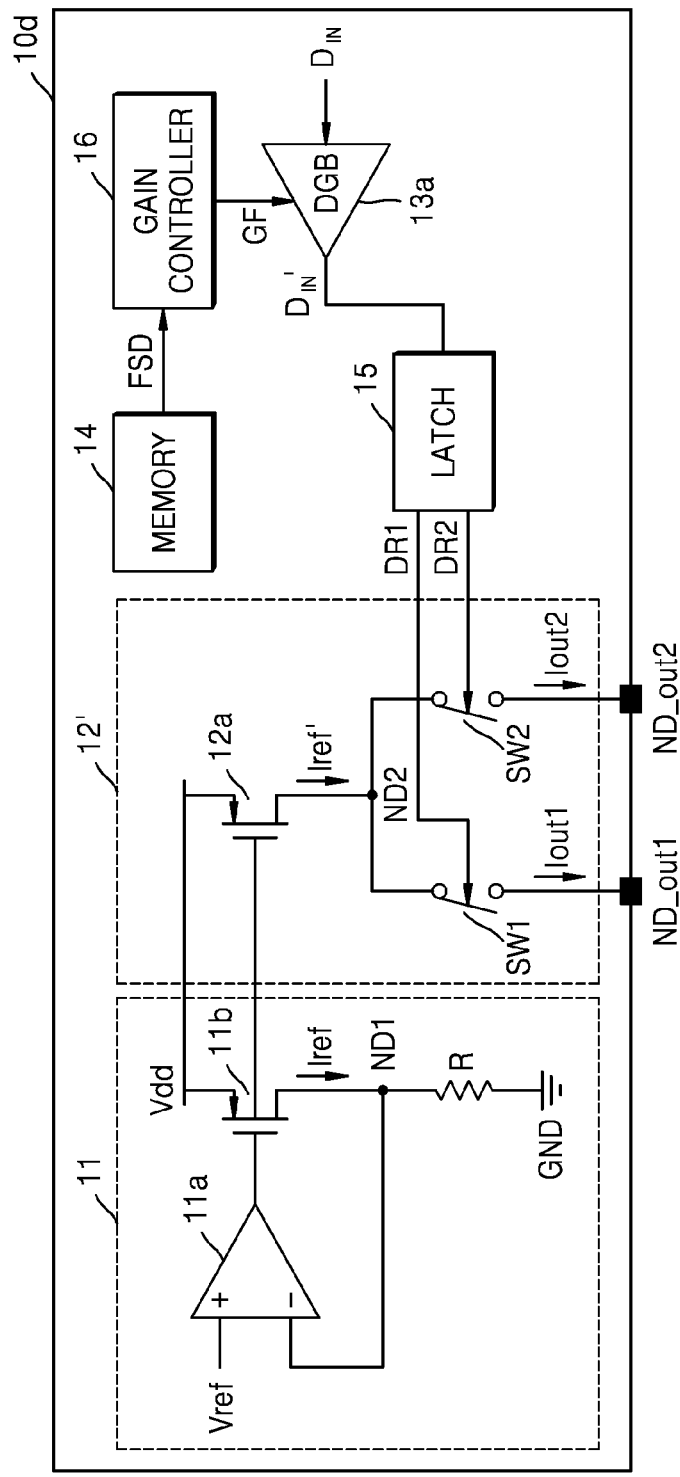

FIG. 5 is a block diagram of a DAC 10d according to an example embodiment.

Referring to FIG. 5, the DAC 10d is a modified example embodiment of the DAC 10c, shown in FIG. 4, and may further include a gain controller 16, compared to the DAC 14c shown in FIG. 4. The gain controller 16 may receive output full-scale data FSD from the internal memory 14, and provide a gain factor GF for controlling the DGB 13a based on the output full-scale data FSD. The gain factor GF may be obtained according to a ratio of reference full-scale data to the output full-scale data FSD. The DGB 13a may provide the calibrated digital input signal $D_{IN}'$ to the conversion circuit 12' by adjusting a digital gain of the digital input signal $D_{IN}$ by using the gain factor GF.

Figure 6:
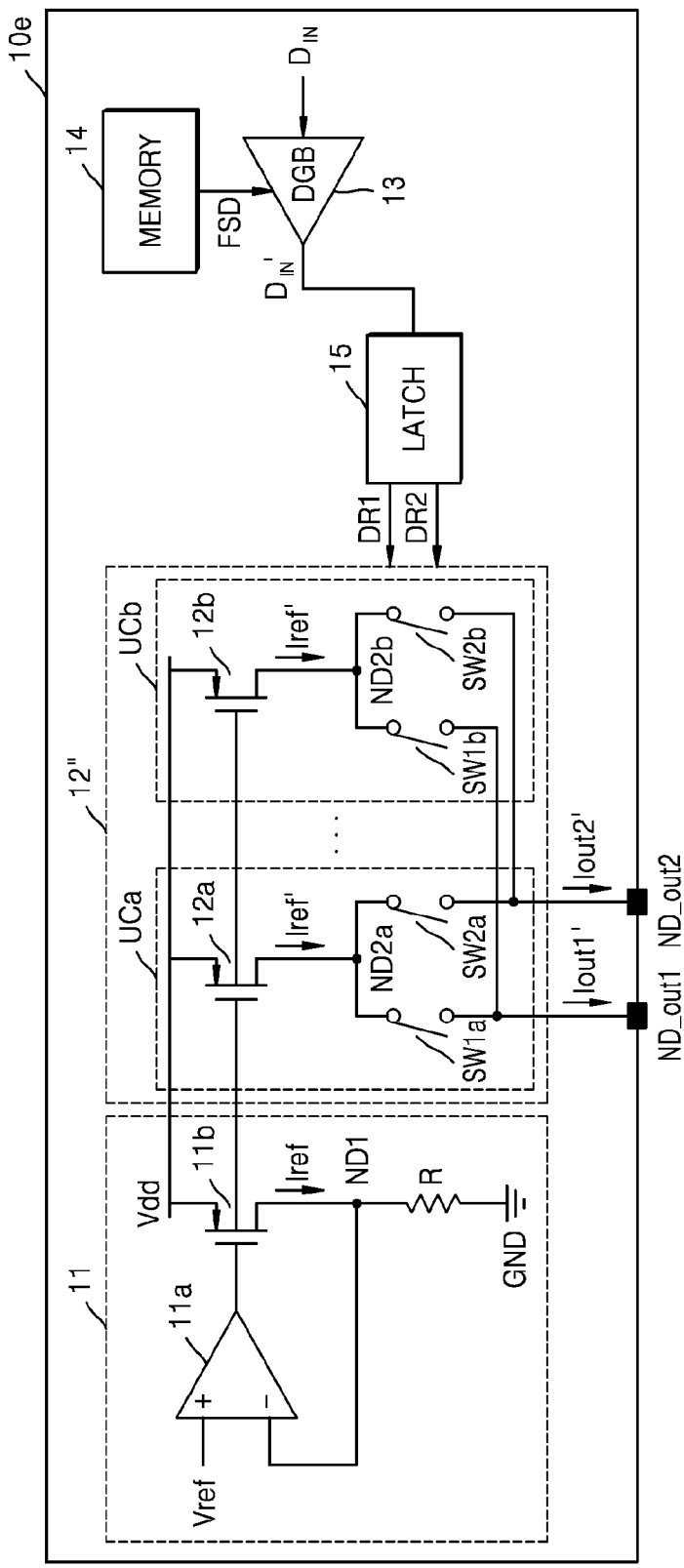

FIG. 6 is a block diagram of a DAC 10e according to an example embodiment.

Referring to FIG. 6, the DAC 10e is a modified example embodiment of the DAC 10c shown in FIG. 4. A conversion circuit 12" may include a plurality of unit cells that include first and second unit cells UCa and UCb. Additionally, the latch 15 may be implemented as a plurality of latches. The number of unit cells and the number of latches may vary with the number of bits of the digital input signal $D_{IN}$. Additionally, the number of unit cells and the number of latches may vary with a size of a current source included in each of the plurality of unit cells (that is, a size of a transistor) and an output current level obtained according to the size of the current source.

According to an example embodiment, if the digital input signal $D_{IN}$ is an N-bit signal, the conversion circuit 12" may include $2^N$ unit cells. The first unit cell UCa may include the second current source 12a connected between a power voltage terminal Vdd and a node ND2a, and a first pair of switches including first and second switches SW1a and SW2a. The second unit cell UCb may include a second current source 12b connected between the power voltage terminal Vdd and a node ND2b, and a second pair of switches including first and second switches SW1b and SW2b. A first analog current signal Iout1' may correspond to sum of current provided via the first switches SW1a and SW1b, and a second analog current signal Iout2' may correspond to sum of currents provided via the second switches SW2a and SW2b.

Figure 7:
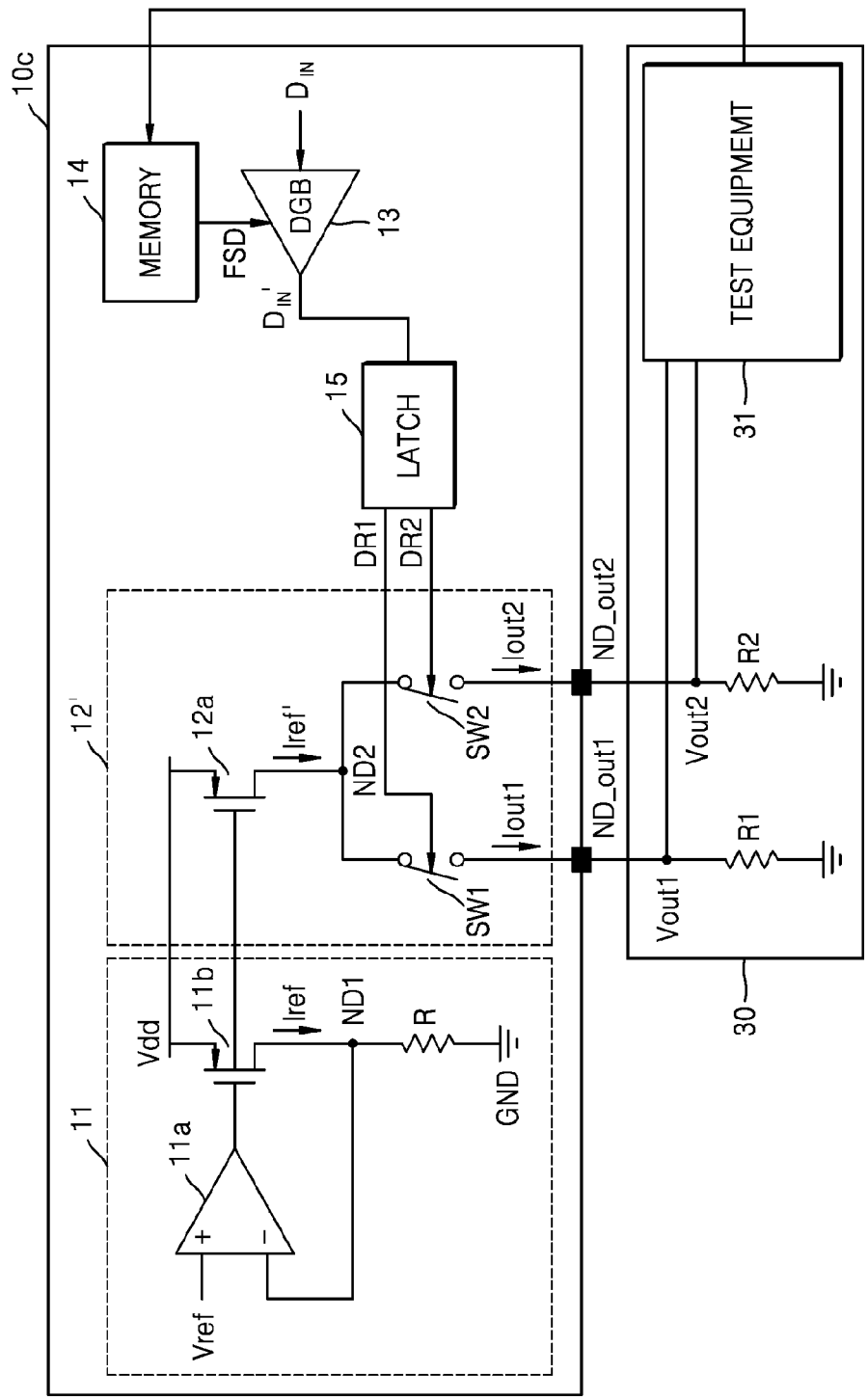
FIG. 7 is a block diagram showing an initial chip test performed on a DAC according to an example embodiment.

FIG. 7 is a block diagram showing an initial chip test performed on the DAC 10c according to an example embodiment.

Referring to FIG. 7, a test board 30 includes test equipment 31 and resistors R1 and R2, and the resistors R1 and R2 may be respectively connected to the first and second output nodes ND_out1 and ND_out2 of the DAC 10c. A first voltage Vout1 may be determined according to the first analog current signal Iout1, output via the first output node ND_out1, and a resistance value of the first resistor R1, and a second voltage Vout2 may be determined according to the second analog current signal Iout2, output via the second output node ND_out2, and a resistance value of the second resistor R2.

The test equipment 31 may sense the first and second voltages Vout1 and Vout2, and provide output data, corresponding to the first and second voltages Vout1 and Vout2, to a chip in which the DAC 10c is configured. In detail, the test equipment 31 may program output data to the internal memory 14. According to an example embodiment, the output data may be a digital value corresponding to the first and second voltages Vout1 and Vout2.

Figure 8:
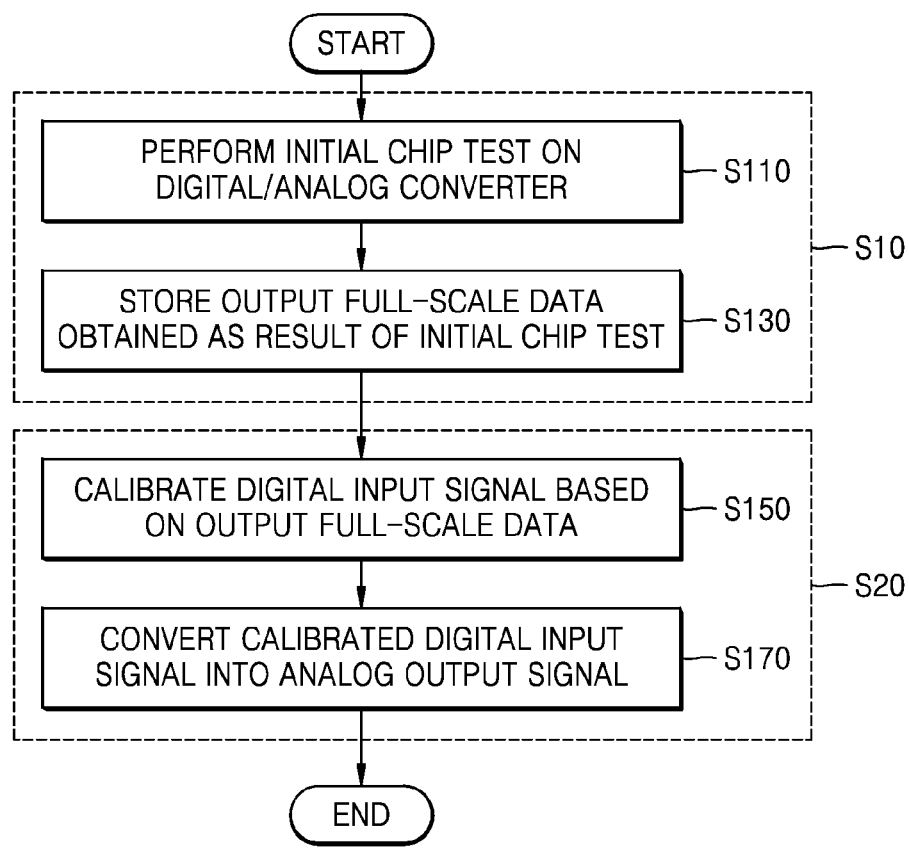
FIG. 8 is a flowchart of a method of calibrating an output from a DAC, according to an example embodiment.

FIG. 8 is a flowchart of a method of calibrating an output from a DAC, according to an example embodiment.

Referring to FIG. 8, the method of calibrating an output from a DAC may be applied to a DAC configured to generate reference current using an internal resistor included in a chip and perform digital/analog conversion by using the generated reference current. For example, the method of calibrating an output from a DAC may be performed on the DAC 10c shown in FIG. 7 and the test board 30. Hereinafter, the method of calibrating an output from a DAC is described in detail with reference to the DAC 10c. However, example embodiments are not limited thereto. For example, the method may be performed on any of the DACs 10a to 10e.

In operation S10, testing may be performed on the DAC 10c in a factory before a chip that includes the DAC 10c is shipped from the factory.

In operation S20, conversion may be performed after the chip that includes the DAC 10c is mounted in an actual product, for example, the communication device CD.

In some example embodiments, the testing of operation S10 may include operations S110 and S130.

In operation S110, an initial chip test is performed on the DAC 10c. In detail, a digital input signal having a maximum value may be applied to the DAC 10c. For example, if a digital input signal is a 4-bit signal, a digital input signal '1111' may be applied to the DAC 10c. The DAC 10c may generate reference current Iref according to an internal resistance value Rin, and convert the digital input signal '1111' into an analog current signal Iout, based on the generated reference current Iref.

In operation S130, output full-scale data FSD obtained as a result of performing the initial chip test is stored. The output full-scale data FSD may be an analog voltage level corresponding to the analog current signal Iout, output from the DAC 10c as a result of the initial chip test performed in operation S110, or a digital value corresponding to the analog voltage level. According to an example embodiment, the output full-scale data FSD may be stored in an internal memory 14 included in the chip. However, example embodiments are not limited thereto, and the output full-scale data may be stored in a memory located outside the chip.

In some example embodiments, the conversion of operation S20 may include operations S150 and S170.

Referring to FIGS. 8 and 9 together, in operation S150, a digital input signal may be calibrated based on output full-scale data to generate a calibrated digital input signal.

FIG. 9 is a table showing full-scale data stored in an internal memory according to an example embodiment.

Referring to FIG. 9, as a result of an initial chip test performed on a DAC, test equipment (for example, the test equipment 31 shown in FIG. 7) may sense an output voltage from an output node of the DAC, and store full-scale data FSD corresponding to the sensed voltage in the internal memory (for example, the internal memory 14). A user may determine (or, alternatively, predetermine) a reference output voltage Vref according to a reference resistance and map, for example, full-scale data corresponding to the reference output voltage Vref, that is, reference full-scale data to 1.00. According to an example embodiment, full-scale data stored in the internal memory may be M-bit data corresponding to 1.00 (M is an integer equal to or greater than 2).

First and second sensed voltages $V\_1$ and $V\_2$ may be higher than the reference output voltage Vref, and full-scale data FSD respectively corresponding to the first and second sensed voltages $V\_1$ and $V\_2$ may be mapped to a value greater than 1.00, for example, respectively to 1.10 and 1.05. Third and fourth sensed voltages $V\_3$ and $V\_4$ may be lower than the reference output voltage Vref, and full-scale data FSD respectively corresponding to the third and fourth sensed voltages $V\_3$ and $V\_4$ may be mapped to a value less than 1.00, for example, respectively to 0.95 and 0.90. According to an example embodiment, full-scale data stored in the internal memory may be M-bit data respectively corresponding to 1.10, 1.05, 0.95, and 0.90.

Referring back to FIG. 8, the calibrated digital input signal may be generated by adjusting a digital gain of a digital input signal, by using a gain factor obtained according a ratio of reference full-scale data to the output full-scale data. According to an example embodiment, the calibrated digital input signal may be generated by performing an operation of multiplying a digital input signal by a gain factor.

For example, a gain factor of the first sensed voltage $V\_1$ is 1.00/1.10. Then, since the gain factor is less than 1, a digital gain is decreased. Accordingly, a calibrated digital input signal may correspond to 1.00/1.10 times the digital input signal. For example, a gain factor of a fourth sensed voltage $V\_4$ is 1.00/0.90. Then, since the gain factor is greater than 1, a digital gain is increased. Accordingly, the calibrated digital input signal may correspond to 1.00/0.90 times the digital input signal.

In operation S170, the calibrated digital input signal may be converted into an analog output signal. In detail, the calibrated digital input signal Din' that is calibrated based on reference current, generated according to an internal resistance value, is converted into an analog output signal Aout.

Accordingly, even if a value of the internal resistance R fluctuates due to tolerance in a process, conversion is performed on the calibrated digital input signal Din', and thus, an accuracy and performance of the DAC 10a to 10e may be enhanced.

Figure 10:
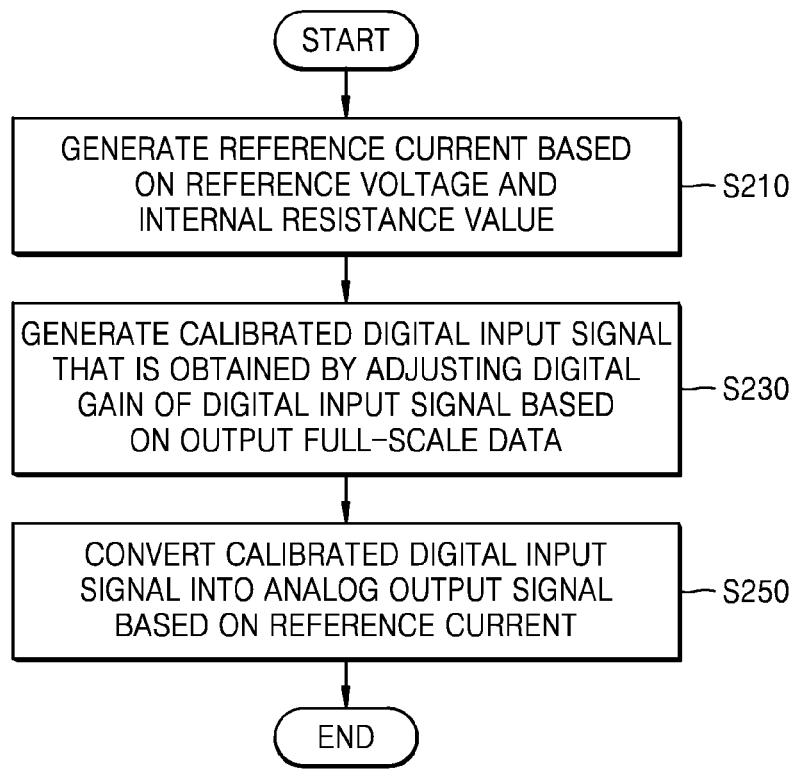
FIG. 10 is a flowchart of a digital/analog conversion method according to an example embodiment.

FIG. 10 is a flowchart of a digital/analog conversion method according to an example embodiment.

Referring to FIG. 10, in some example embodiments, the digital/analog conversion method may be applied to any DAC configured to generate reference current by using an internal resistor included in a chip and perform digital/analog conversion by using the generated reference current. For example, the digital/analog conversion method may be performed by using the DACs 10 and 10a through 10e shown in FIGS. 1 through 8, and the description provided with reference to FIGS. 1 through 9 may be applied thereto.

In operation S210, reference current Iref is generated based on the reference voltage Vref and the internal resistance value Rin.

In operation S230, the calibrated digital input signal Din', obtained by adjusting the digital gain DG of the digital input signal Din based the output full-scale data FSD, is generated.

In operation S250, the calibrated digital input signal Din' is converted into the analog output signal Iout, according to the reference current.

Figure 11:
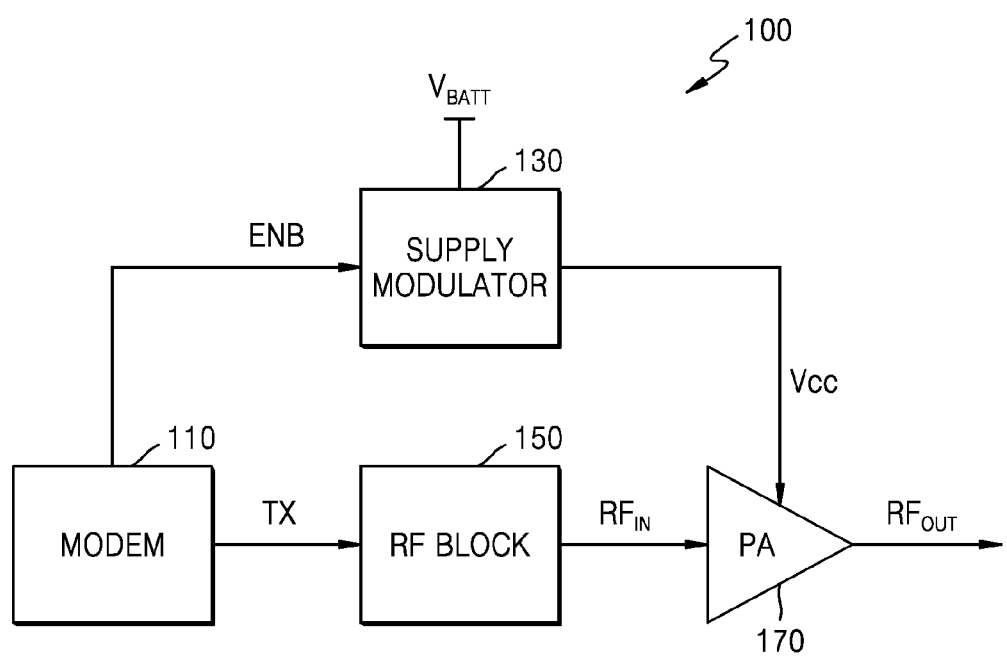
FIG. 11 is a block diagram of a communication device according to an example embodiment.

FIG. 11 is a block diagram of a communication device 100 according to an embodiment.

Referring to FIG. 11, the communication device 100 may include a modem 110, a supply modulator 130, a radio frequency (RF) block 150, and a power amplifier (PA) 170. The modem 110 may process a baseband signal transceived by the communication device 100.

In detail, the modem 110 may generate a digital signal, and generate a digital transmission signal and a digital envelope signal from the generated digital signal. The digital envelope signal may be generated from an amplitude element of the digital transmission signal. The modem 110 may generate an analog transmission signal TX and an analog envelope signal ENB by performing digital/analog conversion on the digital transmission signal and the digital envelope signal.

Figure 12:
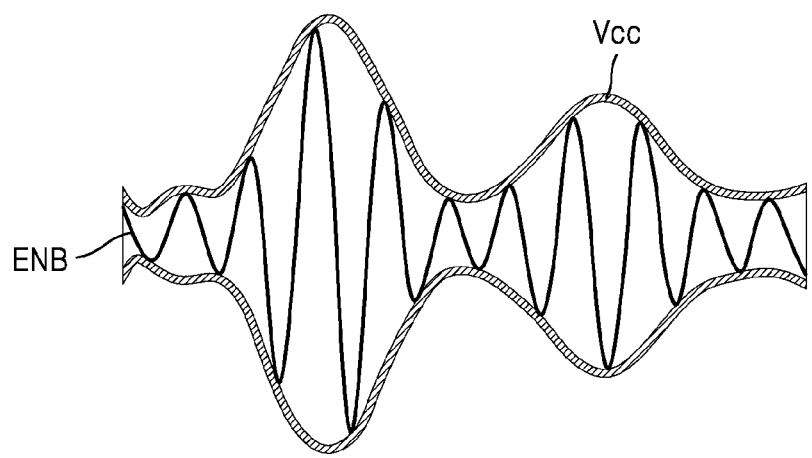
FIG. 12 is a graph for explaining an operation of a supply modulator shown in FIG. 11.

FIG. 12 is a graph for explaining an operation of the supply modulator 130 shown in FIG. 11.

Referring to FIG. 12, the supply modulator 130 may modulate a supply voltage Vcc provided to the PA 170, based on an analog envelope signal ENB. The supply voltage Vcc provided to the PA 170 may be referred to as a bias voltage. If the communication device 100 is a mobile device, the supply modulator 130 may receive a battery voltage $V_{BATT}$. Generally, since a large amount of power, from among power supplied from a battery, is consumed by the PA 170, if power consumed by the PA 170 is reduced, a battery life may increase.

In some example embodiment, the supply modulator 130 may modulate a voltage level of the supply voltage Vcc adaptively to a waveform of the analog envelope signal ENB. In detail, if a level of the analog envelope signal ENB is low, the supply modulator 130 may supply a low voltage, and if a level of the analog envelope signal ENB is high, the supply modulator 130 may supply a high voltage. Accordingly, the supply modulator 130 may increase efficiency of power consumption, and increase battery use time. As such, technology of modulating a voltage level of the supply voltage Vcc adaptively to a waveform of the analog envelope signal ENB is referred to as envelope tracking (ET) technology.

Referring back to FIG. 11, the RF block 150 may generate an RF input signal $RF_{IN}$ by up-converting the analog transmission signal TX. The PA 170 may be driven by the modulated supply voltage Vcc, and generate an RF output signal $RF_{OUT}$ by amplifying power of the RF input signal $RF_{IN}$. The RF output signal $RF_{OUT}$ may be provided to an antenna 190 (See FIG. 14).

Figure 13:
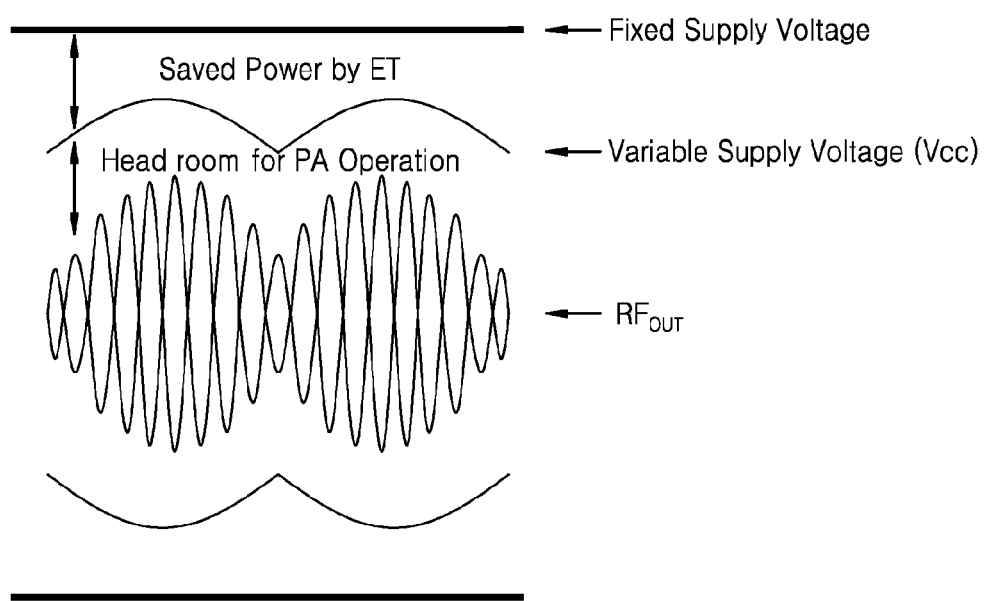
FIG. 13 is a graph for explaining an operation of a power amplifier (PA) shown in FIG. 12.

FIG. 13 is a graph for explaining an operation of the PA 170 shown in FIG. 12.

Referring to FIG. 13, when ET technology is not applied to a communication device, if fixed power, for example, a battery voltage $V_{BATT}$ is provided to the PA 170, there may be a great voltage difference between the RF output signal $RF_{OUT}$ and the fixed power. The voltage difference therebetween may reduce battery life, and cause energy loss that may increase heat generated from the communication device.

In some example embodiment, the communication device 100 may provide a variable supply voltage Vcc to the PA 170 by utilizing ET technology. Accordingly, a voltage difference between the RF output signal $RF_{OUT}$ and the variable supply voltage Vcc may be reduced, and thus, waste of energy may be greatly reduced, and a battery life may increase.

Figure 14:
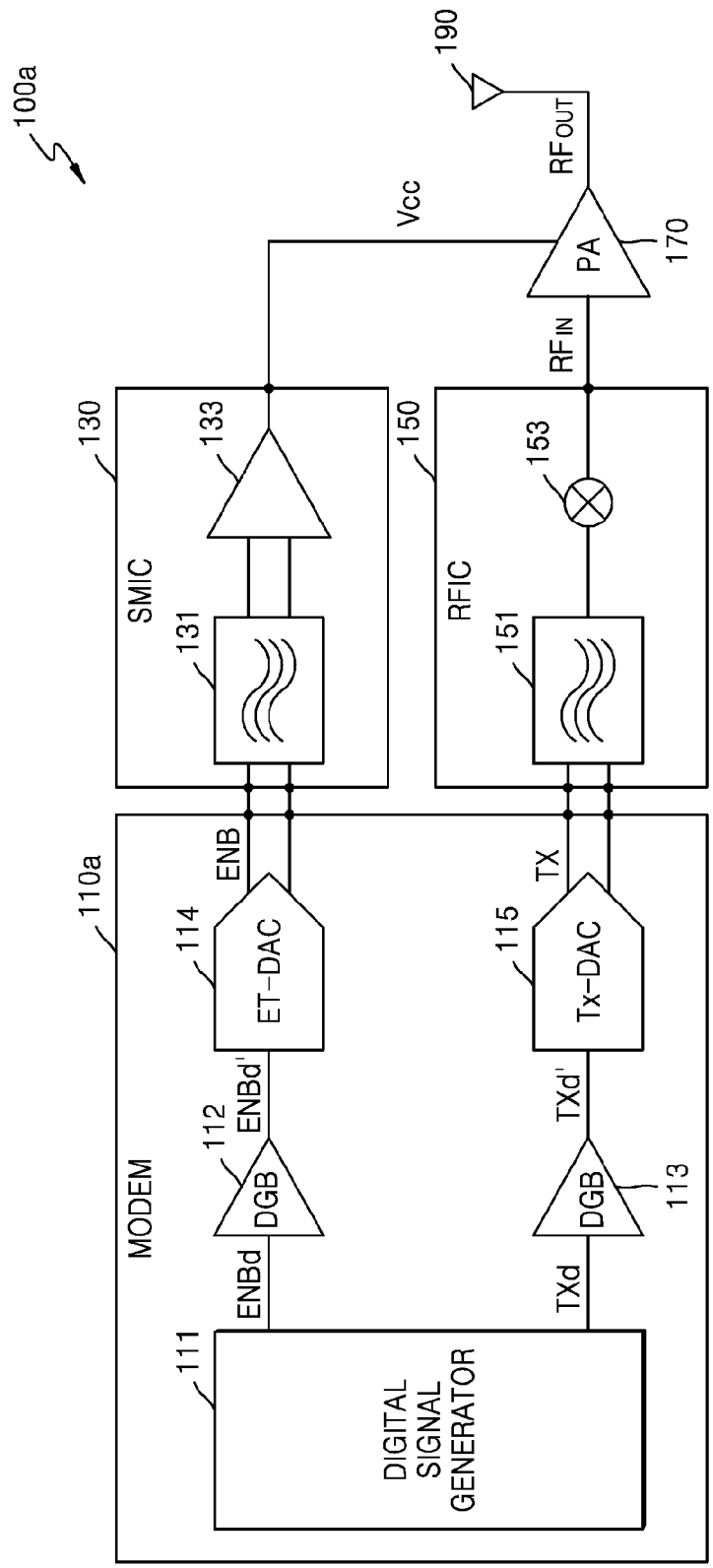
FIGS. 14 and 15 are respective block diagrams of communication devices according to one or more example embodiments.

FIG. 14 is a block diagram of a communication device 100a according to an example embodiment.

Referring to FIG. 14, the communication device 100a may correspond to an example embodiment of the communication device 100 shown in FIG. 11, and the description provided with reference to FIGS. 11 through 13 may be applied thereto.

In some example embodiments, a modem 110a may be implemented as a modem chip, and the supply modulator 130 may be implemented as a power modulation integrated circuit (IC) or a power modulation chip. The RF block 150 may be implemented as a radio frequency integrated circuit (RFIC) or an RF chip. The modem 110a, the supply modulator 130, the RF block 150, and the PA 170 may be mounted together on a printed circuit board (PCB). However, example embodiments are not limited thereto. According to one or more embodiments, the modem 110a, the supply modulator 130, the RF block 150, and the PA 170 may be implemented as a single communication chip.

The modem 110a may include a digital signal generator 111, first and second DGBs 112 and 113, and first and second DACs 114 and 115. For example, the digital signal generator 111 may correspond to the digital signal generator 20 shown in FIG. 1, and the first DGB 112 and the first DAC 114, or the second DGB 113 and the second DAC 115 may correspond to the DACs 10 through 10e shown in FIGS. 1 through 6. Accordingly, the description provided with reference to FIGS. 1 through 10 may be also applied thereto.

The digital signal generator 111 may generate a digital signal (for example, I signal and Q signal), and generate a digital transmission signal TXd and a digital envelope signal ENBd from the generated digital signal. The digital transmission signal TXd may be substantially identical to a digital signal, and the digital envelope signal ENBd may be generated from an amplitude element of the digital signal (that is, $ENBd = \sqrt{I^2 + Q^2}$).

The first DGB 112 may generate a calibrated digital envelope signal ENBd', which is obtained by adjusting a digital gain of the digital envelope signal ENBd based on an internal resistance value in the first DAC 114. In detail, the first DGB 112 may generate the calibrated digital envelope signal ENBd', which is obtained by multiplying the digital envelope signal ENBd by a gain factor. The gain factor may correspond to a ratio of reference full-scale data to output full-scale data that is obtained according to an internal resistance value of the first DAC 114.

The first DAC 114 may generate reference current based on the internal resistance value, and convert the calibrated digital envelope signal ENBd' into an analog envelope signal ENB based on the generated reference current. According to an embodiment, the analog envelope signal ENB may be provided as a differential signal as shown in FIGS. 4 through 7. Accordingly, the first DAC 114 may be implemented as shown in FIGS. 4 through 7.

The second DGB 113 may generate a calibrated digital transmission signal TXd', which is obtained by adjusting a digital gain of the digital transmission signal TXd based on an internal resistance value in the second DAC 115. In detail, the second DGB 113 may generate the calibrated digital envelope signal TXd', which is obtained by multiplying the digital transmission signal TXd by a gain factor. The gain factor may correspond to a ratio of reference full-scale data to output full-scale data that is obtained according to an internal resistance value of the second DAC 115.

The second DAC 115 may generate reference current based on the internal resistance value, and convert the calibrated digital transmission signal TXd' into an analog transmission signal TX based on the generated reference current. According to an embodiment, the analog transmission signal TX may be provided as a differential signal as shown in FIGS. 4 through 7. Accordingly, the first DAC 114 may be implemented as shown in FIGS. 4 through 7.

The supply modulator 130 may include a first low pass filter 131 and an amplifier 133. The low pass filter 131 may perform low pass filtering on the analog envelope signal ENB output from the first DAC 114. The amplifier 133 may receive a differential signal output from the low pass filter 131, and output a supply voltage Vcc by amplifying a difference between received differential signals.

The RF block 150 may include a second low pass filter 151 and a mixer 153. The second low pass filter 151 may perform low pass filtering on an analog transmission signal TX output from the second DAC 115. The mixer 153 may generate an RF input signal $RF_{IN}$ by up-converting an output frequency of the second low pass filter 151.

Figure 15:
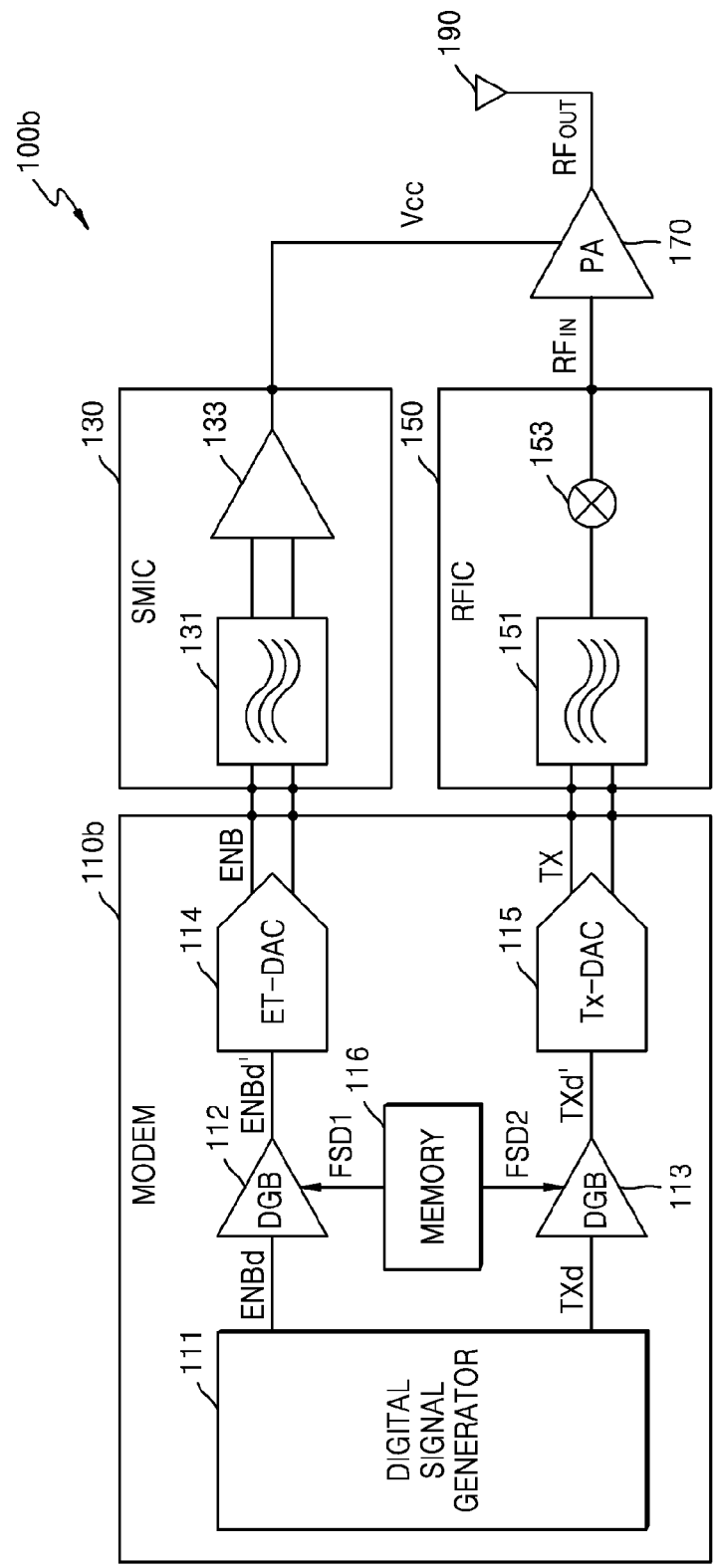

FIG. 15 is a block diagram of a communication device 100b according to an example embodiment.

Referring to FIG. 15, the communication device 100b is a modified example embodiment of the communication device 100a shown in FIG. 14. In some example embodiments, the modem 110b may further include an internal memory 116, compared to the communication device 110a shown in FIG. 14. For example, the internal memory 116 may be implemented as an OTP memory. However, embodiments are not limited thereto, and the internal memory 116 may be an arbitrary memory included in a chip.

The internal memory 116 may store a result of an initial test performed on a modem chip 110b. The result of the initial test may include first output full-scale data FSD1 of the first DAC 114 and/or second output full-scale data FSD2 of the second DAC 115. The first output full-scale data FSD1 may correspond to an analog signal level that is output from the first DAC 114 when a digital envelope signal ENBd having a maximum value is applied to the first DAC 114. The second output full-scale data FSD2 may correspond to an analog signal level that is output from the second DAC 115 when a digital transmission signal TXd having a maximum value is applied to the second DAC 115. Additionally, first and second reference full-scale data, respectively, with respect to the first and second DACs 114 and 115 may be further stored in the internal memory 116.

The first DGB 112 may generate a calibrated digital envelope signal ENBd' that is obtained by calibrating the digital envelope signal ENBd by using a first gain factor obtained according to first reference full-scale data with respect to the first output full-scale data FSD1. The second DGB 113 may generate a calibrated digital transmission signal TXd' that is obtained by calibrating the digital transmission signal TXd by using a second gain factor obtained according to second reference full-scale data with respect to the second output full-scale data FSD2.

As described above with reference to FIGS. 11 through 15, in some example embodiments, a DAC may be included in modem chips 110, 110a, and 110b. However, example embodiments are not limited thereto. According to some other example embodiments, the DAC may be included in the supply modulator 130, the RF block 150, or the PA 170.

Additionally, according to example embodiments, the DAC may be included in a communication chip configured to communicate with various types of external devices according to various types of communication methods. The communication chip may be a wireless fidelity (Wi-Fi) chip, a Bluetooth chip, a wireless communication chip, or a near field communication (NFC) chip, or the like. The Wi-Fi chip and the Bluetooth chip may respectively perform communication by using a Wi-Fi method and a Bluetooth method. If the Wi-Fi chip or the Bluetooth chip is employed, various connection information, such as a service set identifier (SSID), a session key, etc., is transceived in advance. Then, communication is performed by using the connection information so as to transceive various information. The wireless communication chip refers to a chip configured to perform communication according to various communication standards such as institute of electrical and electronics engineers (IEEE), ZigBee, $3^{rd}$ generation (3G), $3^{rd}$ generation partnership project (3GPP), long-term evolution (LTE), or the like. The NFC chip refers to a chip that operates according to an NFC method by using 13.56 MHz, from among various radio-frequency identification (RFID) frequency bands such as 135 kHz, 13.56 MHz, 433 MHz, 860 to 960 MHz, 2.45 GHz, etc.

Further, according to example embodiments, the DAC may be included in various electronic devices. For example, an electronic device may include one or more devices from among a smartphone, a tablet personal computer (PC), a mobile phone, a video phone, an e-book reader, a desktop PC, a laptop PC, a netbook computer, a personal digital assistant (PDA), a portable multimedia player (PMP), a moving pictures expert group audio layer 3 (MP3) player, an accessory, an electronic appcessory, a camera, a wearable device, a wrist watch, a refrigerator, an air conditioner, a vacuum cleaner, an artificial intelligence robot, a television (TV), a digital video disk (DVD) player, an audio player, an oven, a microwave oven, a washing machine, an electronic bracelet, an electronic necklace, an air purifier, an electronic frame, a medical device, a navigation device, a satellite signal receiver, an event data recorder (EDR), a flight data recorder (FDR), a set-top box, a TV box, an electronic dictionary, a vehicle infotainment device, an electronic equipment for ships, avionics, a security device, electronic clothes, an electronic key, a camcorder, game consoles, a head-mounted display (HMD), a flat panel display device, an electronic album, furniture or a part of a building/structure which includes an electronic device, an electronic board, an electronic signature receiving device, and a projector. Additionally, according to example embodiments, the electronic device is not limited the above-described devices.

Figure 16:
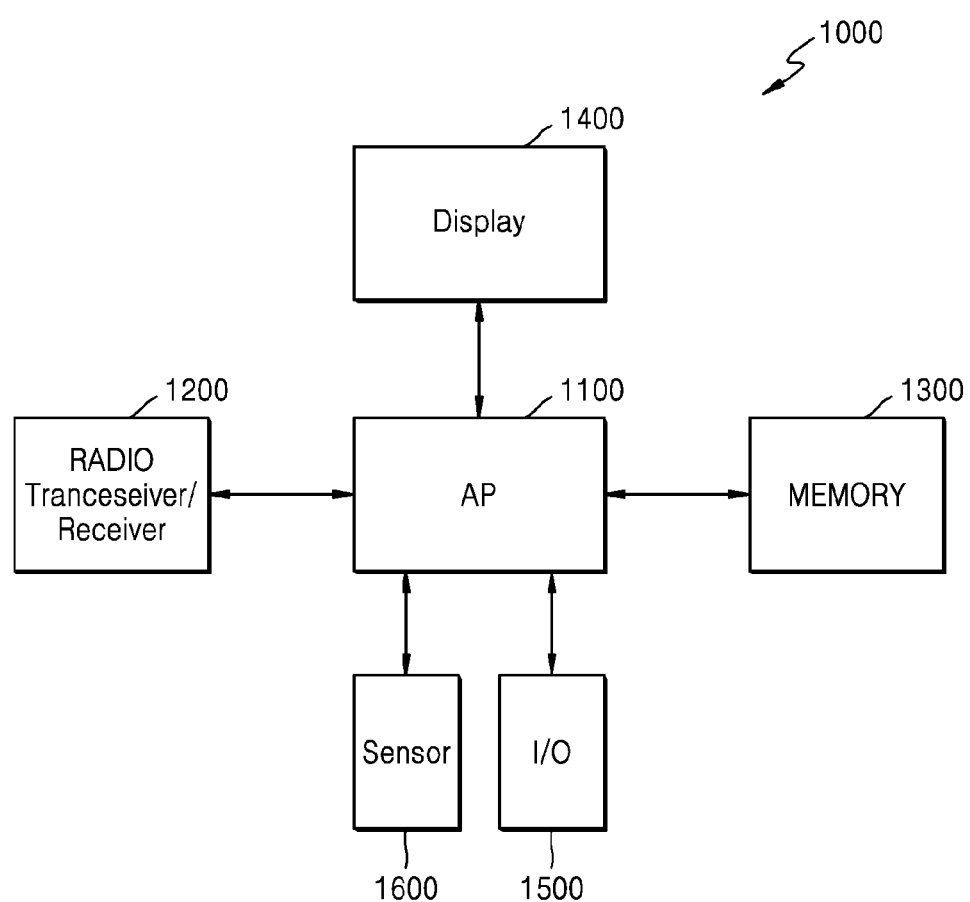
FIG. 16 is a block diagram of an internet of things (IoT) device according to an example embodiment.

FIG. 16 is a block diagram of an internet of things (IoT) device 1000 according to an embodiment.

Referring to FIG. 16, according to embodiments, a DAC may be included in the IoT device 1000. An IoT may refer to a network between things that use wired/wireless communication. The IoT device 1000 may be a device equipped with a wired or wireless interface that may be connected to other devices and transceive data by communicating with one or more other devices via the wired or wireless interface. The wired or wireless interface that may be connected to other devices may include a modem communication interface or the like which may connect to a local area network (LAN), a wireless LAN (WLAN) such as Wi-Fi, a wireless personal area network (WPAN) such as Bluetooth, a wireless universal serial bus (USB), ZigBee, NFC, RFID, power Line communication (PLC) or a mobile cellular network such as 3G, 4th generation (4G), LTE, or the like. The Bluetooth interface may support Bluetooth low energy (BLE).

In detail, the IoT device 1000 may include a communication interface 1200 configured to communicate with the outside. The communication interface 1200 may be a LAN interface, a wireless LAN (WLAN) interface such as Bluetooth, Wi-Fi, or ZigBee, a power line communication (PLC) interface, or a modem communication interface that may connect to a mobile cellular network such as 3G, LTE, or the like. The communication interface 1200 may include a transceiver and/or a receiver. The IoT device 1000 may transmit and/or receive information from an access point or a gateway via the transceiver and/or the receiver. Additionally, the IoT device 1000 may communicate with a user device or other IoT devices, so as to transmit and/or receive control information or data about the IoT device 1000.

In some example embodiments, the transceiver included in the communication interface 1200 may include the DAC. The DAC may be implemented as described above with reference to FIGS. 1 through 15. In detail, the transceiver included in the communication interface 1200 may include a digital signal generator configured to generate a digital input signal, and the DAC configured to convert a digital input signal into an analog output signal. The DAC may generate a calibrate digital input signal that is obtained by adjusting a digital gain of a digital input signal based on a resistance value of an internal resistor, and convert the digital input signal into an analog output signal based on reference current that is obtained according to the internal resistor.

The IoT device 1000 may further include a processor configured to perform an operation or an application processor 1100. The IoT device 1000 may further include a battery configured to supply power to the IoT device 1000 or a power supplier configured to receive power from an outside power source. Additionally, the IoT device 1000 may include a display 1400 configured to display an internal state or data. A user may control the IoT device 1000 via a user interface (UI) on the display 1400 included in the IoT device 1000. The IoT device 1000 may transmit an internal state and/or data to the outside via the transceiver, and receive a control command and/or data from the outside via the receiver.

A memory 1300 may store a control command code, control data, or user data which controls the IoT device 1000. The memory 1300 may include at least one from among a volatile memory and a non-volatile memory. The non-volatile memory may include at least one from among various memories, such as read only memory (ROM), programmable ROM (PROM), electrically programmable ROM (EPROM), electrically erasable and programmable ROM (EEPROM), flash memory, phase-change random access memory (PRAM), magnetic RAM (MRAM), resistive RAM (ReRAM), ferroelectric RAM (FRAM), and the like. The volatile memory may include at least one from among various memories such as dynamic RAM (DRAM), static RAM (SRAM), synchronous DRAM (SDRAM), and the like.

The IoT 1000 may further include a storage device. The storage device may be a non-volatile medium such as a hard-disk drive (HDD), and a solid-state disk (SSD), an embedded multi-media card (eMMC), or a universal flash storage (UFS). The storage device may store user information provided via an input/output unit 1500, and sensed information collected from a sensor 1600.

While example embodiments of the inventive concepts has been particularly shown and described with reference to some example embodiments thereof, it will be understood that various changes in form and details may be made therein without departing from the spirit and scope of the following claims.

What is claimed is:

1. A digital/analog converter (DAC) comprising:
    a reference current generator including an internal resistor, the reference current generator configured to generate a reference current according to a resistance value of the internal resistor and a reference voltage;
    a digital gain block configured to generate a calibrated digital input signal by adjusting a digital gain of a digital input signal based on a ratio between a reference resistance value and a resistance value of the internal resistor such that the digital gain block,
        increases the digital gain, if the resistance value of the internal resistor is greater than the reference resistance value, and
        decreases the digital gain, if the resistance value of the internal resistor is less than the reference resistance value; and
    a conversion circuit configured to convert the calibrated digital input signal into an analog output signal based on the reference current.

2. The DAC of claim 1, further comprising:
    an internal memory configured to store output full-scale data of the DAC, the output full-scale data being based on the resistance value of the internal resistor, and to provide the output full-scale data to the digital gain block.

3. The DAC of claim 2, wherein the digital gain block is configured to generate the calibrated digital input signal by performing an operation on a gain factor and the digital input signal, the gain factor being based on a ratio between reference full-scale data and the output full-scale data, the reference full-scale data being based on the reference resistance value.

4. The DAC of claim 2, wherein
    the output full-scale data corresponds to the digital input signal having a maximum value, and
    the output full-scale data is obtained when an initial chip test on the DAC is performed.

5. The DAC of claim 1, wherein the conversion circuit comprises:
    a switch configured to switch based on the calibrated digital input signal to selectively output the analog output signal.

6. The DAC of claim 1, wherein the conversion circuit comprises:
    a pair of switches including a first switch and a second switch each configured to switch based on the calibrated digital input signal to selectively output a first output signal and a second output signal, respectively, the first and second output signals constituting the analog output signal.

7. The DAC of claim 6, further comprising:
    a latch configured to latch the calibrated digital input signal, and to provide a first driving signal to the first switch, and a second driving signal to the second switch, the second driving signal having an inverted level with respect to the first driving signal.

8. The DAC of claim 1, wherein the reference current generator comprises:
    the internal resistor;
    an amplifier having a first input terminal configured to receive the reference voltage, and a second input terminal connected to the internal resistor; and
    a current source connected to the internal resistor, configured to generate the reference current based on an output from the amplifier.

9. A communication device comprising:
    a digital signal generator configured to generate at least one digital input signal; and
    a digital/analog converter (DAC) configured to,
        generate at least one calibrated digital input signal by adjusting a digital gain of the at least one digital input signal based on a resistance value of an internal resistor, and
        convert the at least one calibrated digital input signal into at least one analog output signal based on reference current, the reference current being based on the internal resistor.

10. The communication device of claim 9, wherein the DAC comprises:
    a reference current generator including the internal resistor, the reference current generator configured to generate the reference current according to a resistance value of the internal resistor and a reference voltage;
    a digital gain block configured to generate the at least one calibrated digital input by adjusting a digital gain of the at least one digital input signal based on a ratio of a resistance value of the internal resistor to a reference resistance value; and
    a conversion circuit configured to convert the at least one calibrated digital input signal into the at least one analog output signal based on the reference current.

11. The communication device of claim 10, further comprising:
    an internal memory configured to store output full-scale data of the DAC, the output full-scale data being based on the resistance value of the internal resistor, and to provide the output full-scale data to the digital gain block.

12. The communication device of claim 10, wherein the at least one digital input signal includes a digital transmission signal and a digital envelope signal, and the DAC comprises:
    a first DAC configured to convert the digital envelope signal into an analog envelope signal such that the analog envelope signal is one of the at least one analog output signal; and
    a second DAC configured to convert the digital transmission signal into an analog transmission signal such that the analog transmission signal is a second one of the at least one analog output signal.

13. The communication device of claim 12, further comprising:
a supply modulator configured to modulate power based on the analog envelope signal;
a radio frequency (RF) block configured to generate an RF signal from the analog transmission signal; and
a power amplifier configured to operate based on the modulated power, and to generate an RF output signal by amplifying power of the RF signal.

14. The communication device of claim 12, wherein the first DAC comprises:
a reference current generator including the internal resistor, the reference current generator configured to generate the reference current according to the resistance value of the internal resistor and the reference voltage;
a digital gain block configured to generate a calibrated digital envelope signal by adjusting a digital gain of the digital envelope signal based on a ratio of the resistance value of the internal resistor to a reference resistance value; and
a conversion circuit configured to convert the calibrated digital envelope signal into the analog envelope signal based on the reference current.

15. A digital-to-analog converter (DAC) configured to convert a digital input signal to an analog output signal, the DAC comprising:
an internal resistor having an internal resistance value associated therewith, the internal resistor configured to have a first reference current flowing therethrough; and
processing circuitry configured to,
generate a calibrated digital input signal by adjusting a digital gain of the digital input signal based on a reference resistance value and the internal resistance value such that the processing circuitry (i) increases the digital gain, if the internal resistance value is greater than the reference resistance value, and (ii) decreases the digital gain, if the internal resistance value is less than the reference resistance value, and
convert the calibrated digital input signal into the analog output signal based on the first reference current.

16. The DAC of claim 15, wherein the processing circuitry is configured to,
generate output full-scale data (FSD) based on a voltage level of the analog output signal at a first time such that the output FSD is based on the internal resistance value, and
store the output FSD and reference FSD in a memory device associated with the DAC, the reference FSD being based on Hall the reference resistance value.

17. The DAC of claim 16, wherein the processing circuitry is configured to adjust the digital gain of the digital input signal by varying an amplitude of the digital input signal based on the output FSD and the reference FDS.

18. The DAC of claim 17, wherein the processing circuitry is configured to vary the amplitude of the digital input signal by,
determining a gain factor based on a ratio between the reference FDS and the output FSD, and
multiplying the digital input signal by the gain factor to generate the calibrated digital input signal.

19. The DAC of claim 15, wherein the processing circuitry is configured to,
generate the analog output signal based on a second reference current, the second reference current being proportional to the first reference current, and
selectively output the analog output signal based on the calibrated digital input signal.

* * * * *